United States Patent
Oguri et al.

[11] Patent Number: 5,837,617
[45] Date of Patent: Nov. 17, 1998

[54] HETEROJUNCTION COMPOUND SEMICONDUCTOR DEVICE AND METHOD OF MANUFACTURING THE SAME

[75] Inventors: Hiroyuki Oguri; Teruo Yokoyama, both of Kawasaki, Japan

[73] Assignee: Fujitsu Limited, Kanagawa, Japan

[21] Appl. No.: 221,900

[22] Filed: Apr. 1, 1994

[30] Foreign Application Priority Data

Apr. 30, 1993 [JP] Japan .................................. 5-104506

[51] Int. Cl.⁶ .................................................. H01L 21/302
[52] U.S. Cl. ........................ 438/738; 438/740; 438/718
[58] Field of Search ..................... 156/643, 662, 156/646, 627, 626, 653, 652; 437/126, 133; 438/737, 738, 740, 710, 718

[56] References Cited

U.S. PATENT DOCUMENTS

| | | | |
|---|---|---|---|
| 4,615,102 | 10/1986 | Suzuki | 156/646 |
| 4,640,737 | 2/1987 | Nagasaka et al. | 252/79.1 |
| 5,118,637 | 6/1992 | Ishikawa | 437/41 |
| 5,160,994 | 11/1992 | Shimawaki | 252/190 |
| 5,411,632 | 5/1995 | Delage et al. | 156/646 |

FOREIGN PATENT DOCUMENTS

| | | |
|---|---|---|
| 0 492 951 | 7/1992 | European Pat. Off. . |
| 0 539 963 | 5/1993 | European Pat. Off. . |
| 58-206126 | 1/1983 | Japan . |
| 61-22629 | 1/1986 | Japan . |
| 63-072158 | 4/1988 | Japan . |
| 05267243 | 10/1993 | Japan . |
| 5-267243 | 10/1993 | Japan . |

OTHER PUBLICATIONS

"Dry–Etch Monitoring of III–V Heterostructures Using Laser Reflectometry and Optical Emission Spectroscopy"; Collot et al.; J. Vac. Sci Tech., B (1991), 9(5), abstract.

*Primary Examiner*—R. Bruce Breneman
*Assistant Examiner*—George Goudreau
*Attorney, Agent, or Firm*—Armstrong, Westerman, Hattori, McLeland & Naughton

[57] ABSTRACT

A laminated layer having a layer containing Al (In) and a layer not containing Al (In) alternately laminated one upon another is plasma etched by an etchant gas which can etch both the layers containing and not containing Al (In). An additive gas containing F is added to the etchant gas while a layer not containing Al (In) is etched. When the surface of the layer containing Al (In) is exposed, fluorides are formed on the surface of the layer containing Al (In) and the etching is automatically stopped. An emission peak specific to Al (In) is monitored to detect which layer is presently etched.

13 Claims, 7 Drawing Sheets

HETEROJUNCTION COMPOUND SEMICONDUCTOR DEVICE AND METHOD OF MANUFACTURING THE SAME

BACKGROUND OF THE INVENTION a) Field of the Invention

The present invention relates to a semiconductor device and its manufacturing method, and more particularly to a semiconductor device having a heterojunction compound semiconductor laminated layer.

b) Description of the Related Art

There are various kinds of compound semiconductor devices having a heterojunction compound semiconductor laminated layer. For example, a heterojunction FET (HFET), including a high electron mobility transistor (HEMT), which is one kind of field effect transistors (FET) has a heterojunction at an interface between a compound semiconductor layer (two dimensional electron/hole carrier transport channel) having a relatively narrow band gap and another compound semiconductor barrier layer (in the case of HEMT, impurity doped carrier supply layer) having a relatively wide band gap.

A narrow potential valley is formed in the carrier transport channel layer adjacent the interface with the barrier layer and provides a transport channel for two dimensional electron gas (2DEG). A HEMT has a barrier layer doped with n-type impurities and a carrier transport channel which is non-doped or lightly doped with n-type impurities. Even when the barrier layer is non-doped, a carrier transport channel for 2DEG is formed. When carriers are supplied, e.g. from the source electrode, a current is allowed to flow. Although higher mobility is made possible by lowering the impurity concentration in the carrier transport layer, the carrier transport layer may be doped. Positive holes can also be used as carriers. The term "HFET" stands for HEMT-like transistors including these variations.

In forming a complementary HFET (HEMT) circuit effective for a low power consumption, generally, an n-channel carrier transport channel and a barrier layer and a p-channel carrier transport channel and a barrier layer are laminated.

In forming a transistor by using underlying semiconductor layers, upper semiconductor layers are etched. For the mass production of integrated semiconductor circuits, it is necessary to precisely control the etching amount in order to obtain uniform properties of semiconductor elements.

Figure 8A:
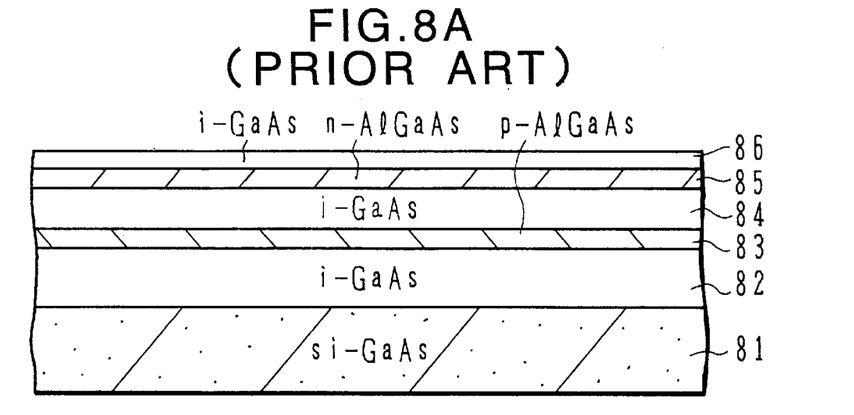
FIGS. 8A to 8C are schematic cross sectional views explaining a conventional method of forming a complementary HFET structure.
Figure 8B:
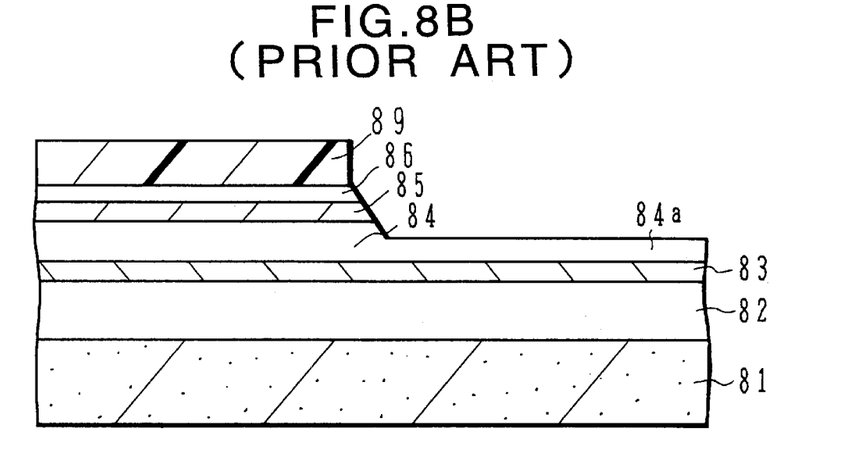
Figure 8C:
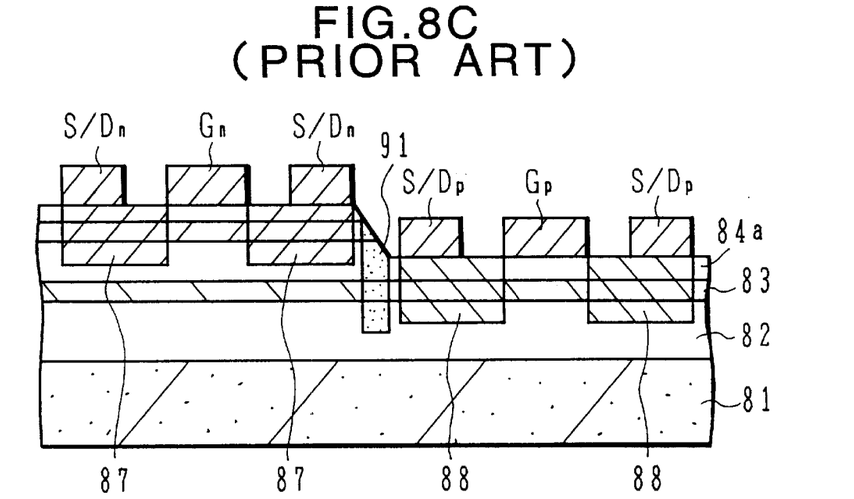

FIGS. 8A to 8C illustrate examples of a conventional method of manufacturing a complementary HFET which is a so-called HEMT.

As shown in FIG. 8A, an i-type GaAs layer 82, a p-type AlGaAs layer 83, an i-type GaAs layer 84, an n-type AlGaAs layer 85, and an i-type GaAs layer 86 are laminated in this order on a semiinsulating GaAs wafer 81, by metal organic chemical vapor deposition (MOCVD).

As shown in FIG. 8B, a photoresist mask 89 having an opening at a p-type HFET forming region is formed on the wafer surface. The i-type GaAs layer 86, n-type AlGaAs layer 85, and the upper region of the i-type GaAs layer 84 are etched by using an aqueous solution of $H_2O_2$+HF as an etchant, leaving an i-type GaAs layer 84a having a predetermined thickness. Thereafter, the resist mask 89 is removed.

As shown in FIG. 8C, a tungsten silicide $WSi_x$ layer is formed on the wafer surface and patterned by using a resist mask or the like, to thus form a gate electrode Gn for an n-type HFET and a gate electrode Gp for a p-type HFET.

Next, a resist mask having openings at ohmic electrode forming regions for the p-type HFET is formed and Be and F ions are doped through the openings. Instead of Be as a p-type impurity, Mg or the like may be used. F for increasing an impurity activation yield may be omitted.

Next, a resist mask having openings at ohmic electrode forming regions for the n-type HFET is formed, and Si ions are doped through the openings.

After p- and n-type impurities are doped, the wafer is heated to undergo activation annealing. This annealing forms a $N^+$-type regions 87 at the Si doped regions and a $p^+$type regions 88 at the Be and Fe doped regions.

Next, a resist mask having an opening for separating the n-type HFET and p-type HFET is formed, and oxygen ions are doped to form a separation region 91.

Thereafter, a resist mask having openings at the ohmic electrode forming regions of the p- and n-type HFETs is formed to vapor deposit an ohmic electrode material. After a lift-off process, alloying is performed to form source/drain electrodes S/D. For example, a stacked layer of an AuGe layer, an Ni layer, and an Au layer is used for the n-type HFET source/drain electrodes S/Dn, and a stacked layer of an Au layer, a Zn layer, and an Au layer is used for the p-type HFET source/drain electrodes S/Dp. Thereafter wirings are connected to the electrodes of the p- and n-type HFETs.

The i-type GaAs layer 82 forming the channel of the p-type HFET is separated from the gate electrode Gp by the p-type AlGaAs layer 83 and the left i-type GaAs layer 84a. The threshold voltage of the p-type HFET therefore changes with a thickness of the left i-type GaAs layer 84a. In order to obtain uniform characteristics of P-type HFETs, it is necessary to precisely control the etching amount of the i-type GaAs layer 84.

The region where the p-type HFET is formed is isotropically wet etched so that the peripheral area of this region is slanted. This slanted area is difficult to be used as device regions.

A process of etching a plurality of layers made of a plurality kind of materials is also used for manufacturing other compound semiconductor devices. However, it has been difficult to efficiently and precisely etch a heterojunction structure having a laminated layer of two or more compound semiconductor layers.

SUMMARY OF THE INVENTION

It is an object of the present invention to provide a technique allowing a heterojunction structure to be efficiently and precisely etched.

It is another object of the present invention to provide a heterojunction semiconductor device easy to manufacture and easy to control its characteristics.

According to one aspect of the present invention, there is provided an etching method comprising the steps of: etching a laminated layer of a plurality of layers made of two different kinds of materials by an etchant gas A until one of the layers made of one kind of material is completely etched, the etchant gas A being capable of etching both layers made of the two different kinds of materials and the layer made of the one kind of material being substantially unetched by the etchant gas A added with an additive gas B; and etching an underlying layer under the one layer made of the one kind of material by adding the additive gas B to the etchant gas A while the underlying layer is etched.

The laminated layer can be efficiently etched by an etchant A, and the etching can be stopped precisely by adding an additive gas B to the etchant A.

According to another aspect of the present invention, there is provided a method of manufacturing a heterojunction semiconductor device having a semiconductor substrate and a semiconductor laminated layer formed on the semiconductor substrate, the semiconductor laminated layer having a first compound semiconductor layer not containing Al as the composition, a second compound semiconductor layer formed on the first compound semiconductor layer, the second compound semiconductor layer containing Al as the composition, a third compound semiconductor layer formed on the second compound semiconductor layer, the third compound semiconductor layer not containing Al as the composition, and a fourth compound semiconductor layer formed on the third compound semiconductor layer, the fourth compound semiconductor layer containing Al as the composition, the method comprising: a first etching step of etching the fourth compound semiconductor layer and part of the third compound semiconductor layer by an etchant gas containing Cl or Br and not containing F; and a second etching step of etching the remaining part of the third compound semiconductor layer by an etching gas containing F and Cl, or F and Br.

If a laminated layer has a compound semiconductor layer containing Al and another compound semiconductor layer not containing Al, the former compound semiconductor layer can be used as an etching stop layer by adding F to an etching gas. Since the compound semiconductor layer containing Al can be made substantially not to be dry-etched, a precise etching is possible.

The characteristics of heterojunction semiconductor devices can be correctly controlled because etching can be controlled precisely.

DETAILED DESCRIPTION OF THE PREFERRED EMBODIMENTS

Embodiments of the present invention will be described with reference to the accompanying drawings.

Figure 1A:
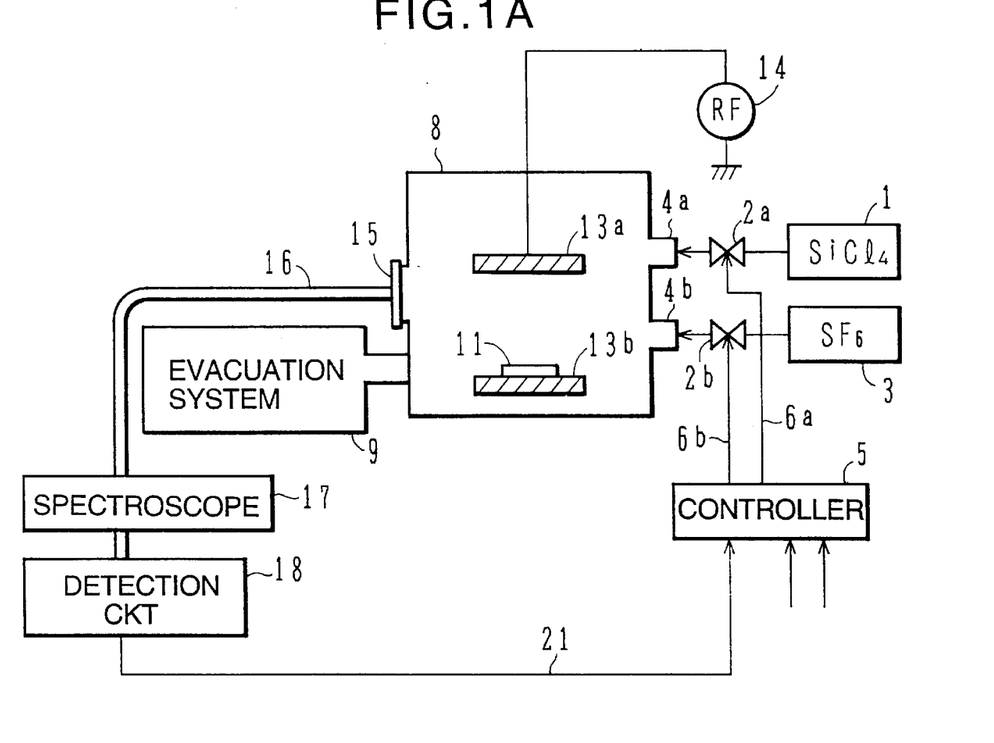
FIGS. 1A and 1B are a schematic diagram of an etching apparatus and a graph showing etching speeds relative to an etchant, according to an embodiment of the present invention.

FIG. 1A shows an example of the structure of an etching apparatus. A main etchant gas source 1, for example, $SiCl_4$ gas source, is connected via an electromagnetic valve 2a to a main etchant gas inlet port 4a of a hermetic chamber 8. An additive gas source 3, for example, $SF_6$ gas source, is connected via an electromagnetic valve 2b to an additive gas inlet port 4b of the hermetic chamber 8.

The opening degrees of the electromagnetic valves 2a and 2b are controlled by control signals supplied from a controller 5 via control lines 6a and 6b. Parallel plate electrodes 13a and 13b are disposed in the hermetic chamber 8.

The lower parallel electrode 13b is connected to a ground potential, and adapted to place thereon a wafer 11 to be processed. The upper parallel electrode 13a is connected to an RF power source 14. The hermetic chamber 8 is connected to an evacuation system 9 which can evacuate the inner space of the hermetic chamber to a desired degree of vacuum.

After the hermetic chamber 8 is evacuated and an etching gas is supplied from the main etchant gas inlet port 4a to the inside of the hermetic chamber at a predetermined pressure, an RF electric power is supplied between the parallel electrodes 13a and 13b so that plasma of the etching gas is generated.

A window 15 is mounted on the hermetic chamber 8 at the position where plasma emission is received. An optical fiber 16 is connected between the window 15 and a spectroscope 17 so as to send plasma emission incident to the window 15 to the spectroscope 17 which selects one of spectra of the plasma emission.

A monochromatic ray selected by the spectroscope 17 is supplied to a detection circuit 18 including an optical detector such as a photomultiplier. A signal detected by the detection circuit 18 is supplied via a signal line 21 to a controller 5. The controller 5 is supplied with other signals such as an etching start signal and an etching end signal.

In the following description, it is assumed that the wafer 11 to be etched is a laminated layer of GaAs layers and AlGaAs layers, the main etching gas is $SiCl_4$, and the additive gas is $SF_6$.

Figure 1B:
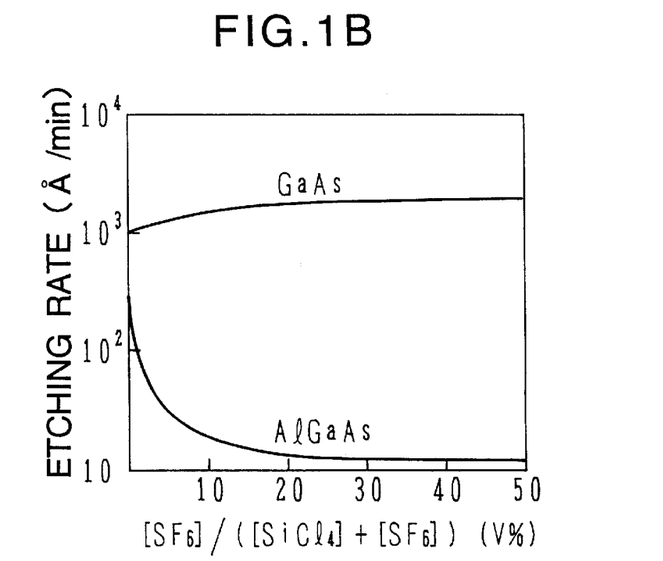

FIG. 1B is a graph showing a change in etching speeds of GaAs and AlGaAs when $SF_6$ gas is added to $SiCl_4$. The abscissa represents a ratio (V %) of a flow (additive amount) of $SF_6$ gas to a total flow of $SiCl_4$ and $SF_6$, and the ordinate represents an etching speed (A/min).

The etching speeds of GaAs and AlGaAs are generally equal when only $SiCl_4$ gas is used without adding $SF_6$ gas. As $SF_6$ gas is added to $SiCl_4$, the etching speed of GaAs increases gradually, whereas the etching speed of AlGaAs lowers quickly.

As $SF_6$ gas is added about 20%, the etching speed of AlGaAs becomes 1/80 the etching speed of GaAl or lower. As $SF_6$ gas is added about 30% or more, the etching speed of AlGaAs becomes about 1/100 the etching speed of GaAs or lower. If two etching speeds differ by about two digits, it can be considered that a layer having a lower etching speed is hardly etched. This state is called a substantially unetched state.

As $SiCl_4$ gas is supplied from the main etchant gas source 1 to the inside of the hermetic chamber 8 and an RF electric power from the RF power source is supplied between the parallel electrodes, plasma is generated in the hermetic chamber 8. Under this condition, the etching is performed substantially at an equal speed irrespective of whether the layer on the wafer 11 is GaAs or AlGaAs. As $SF_6$ gas is added to $SiCl_4$ more than a predetermined amount, AlGaAs is substantially unetched.

Figure 2A:
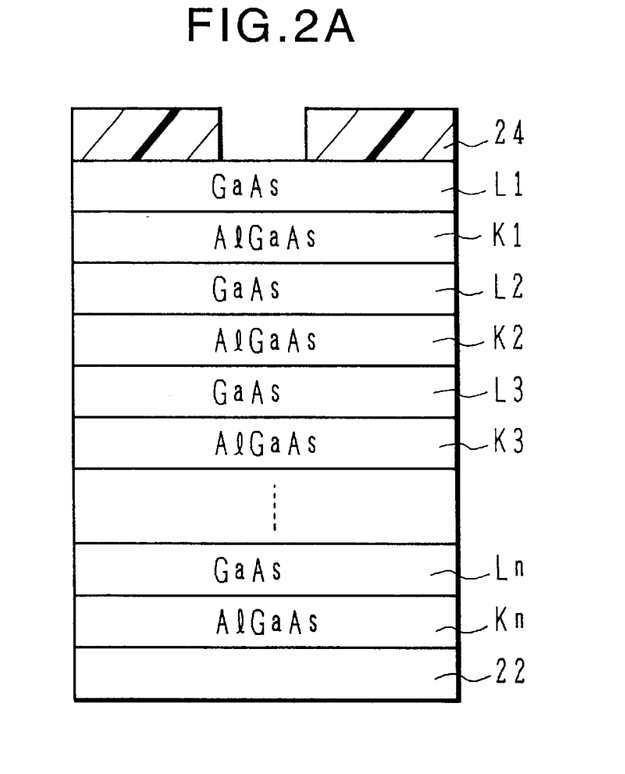
FIGS. 2A and 2B are a schematic diagram showing an example of a heterojunction laminated layer structure to be etched and a graph showing monitor signal waveforms.

FIG. 2A shows an example of a heterojunction laminated layer structure which can be precisely and efficiently etched by using the etching apparatus shown in FIG. 1A. On a substrate 22, n sets of a GaAs layer L and an AlGaAs layer K are laminated one upon another. A resist mask 24 having an opening is formed on the surface of this substrate 22. The substrate 22 is placed on the lower electrode 13b of the etching apparatus shown in FIG. 1A, and the GaAs/AlGaAs laminated layer exposed in the opening is etched.

Figure 2B:
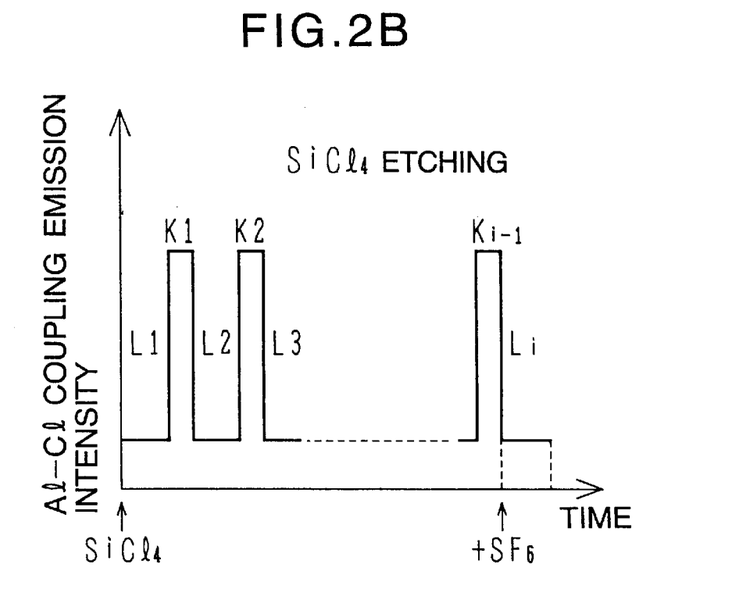

FIG. 2B is a graph showing waveforms of detection signals detected by the detection circuit 18 when the substrate shown in FIG. 2A is placed on the parallel electrode 13b of the etching apparatus shown in FIG. 1A and etched by supplying the main etching gas of $SiCl_4$. The spectroscope 17 is set to a peak emission wavelength of 261 nm of Al-Cl coupling, and the detection circuit 18 detects light having the wavelength of 261 nm.

An emission peak by Al-Cl coupling is not generated while the uppermost GaAs layer L1 is etched, because this layer has no composition of Al. Therefore, a detection signal detected by the detection circuit takes a low level. When the next AlGaAs layer K1 starts being etched, emission by Al-Cl coupling starts, and a detection signal of the detection circuit 18 changes to a high level. When the etching of the AlGaAs layer K1 is completed, the peak of Al-Cl coupling extinguishes, and the detection signal changes to the low level.

While the GaAs layer L2 of the second set is etched, emission peak by Al-Cl coupling is not generated, and the detection signal is maintained to take the low level. When the AlGaAs layer K2 of the second set starts being etched, the emission intensity of Al-Cl coupling changes again to the high level.

In the above manner, emission by Al-Cl coupling is not generated while a GaAs layer is etched, but emission by Al-Cl coupling is generated when an AlGaAs layer starts being etched and the detection signal changes to the high level. Accordingly, by monitoring the detection signal of the detection circuit, what layer is presently etched can be known.

If etching is to be stopped at the surface of the AlGaAs layer K1 of the i-th set, additive gas $SF_6$ is added by a predetermined amount after the emission peak by Al-Cl coupling at the (i−1)-th layer extinguishes. When $SF_6$ gas is added to the main etchant, although the GaAs layer Li of the i-th set is etched, Al fluoride is formed when the i-th AlGaAs layer is exposed on the surface of the wafer. As a result, the etching speed lowers rapidly, and the etching takes the substantially unetched state.

After the GaAs layer Li of the i-th set is etched for a sufficient time period by using $SiCl_4+SF_6$ gas, the RF power is shut down and the supply of the etching gas is terminated. The etching is therefore stopped exposing the surface of the AlGaAs layer Ki of the i-th set.

As described above, a predetermined emission peak of plasma emission is detected to monitor what layer is presently etched, and $SF_6$ gas is added by a predetermined amount while a GaAs layer L is etched, to thereby stop the etching at the surface of the next AlGaAs layer K.

A plurality of laminated layer sets each having a GaAs layer and an AlGaAs layer can be efficiently etched by using an etching gas which can etch both GaAs and AlGaAs layers until the lowermost layer to be etched enters the etching state. When additive gas is added, the etching is automatically stopped at the surface of the underlying layer. Therefore, the etching can be stopped precisely and uniformly.

The laminated layer structure having each set of a GaAs layer stacked upon an AlGaAs layer has been described. The same etching control is applicable also to a set of an AlGaAs layer stacked upon a GaAs layer.

An automatic etching stop by using two etching speeds having a very large difference therebetween has been described for the case of a laminated layer of a layer containing Al and a layer not containing Al. A combination of such layers is not limitative, but another combination of a layer containing In and a layer not containing In may also be used for the automatic etching stop by using the same main etching gas and additive gas. $SiCl_4$ gas can etch generally equally both the layer containing In and the layer not containing In, and if $SF_6$ is added to $SiCl_4$ by a predetermined amount, the layer containing In cannot be etched.

Accordingly, by using $SiCl_4$ as the main etchant and $SF_6$ as the additive etchant, etching can be automatically stopped at the surface of the layer containing In. An example of such a laminated layer is a laminated layer of an InGaAs layer and a GaAs layer.

Instead of $SiCl_4$ for etching both the layers containing and not containing Al or In, $Cl_2$ or $CCl_4$ gas may be used.

Instead of $SF_6$ for stopping etching at the surface of the layer containing Al or In, other gasses may be used selected from one or a combination of tetrafluorocarbon $CF_4$, chlorofluorocarbon $CCL_xF_y$, hydrochrolofluorocarbon $CH_xCl_yF_z$, hydrofluorocarbon $CH_xF_y$, halon containing fluorine $CBr_xCl_yF_z$.

Examples of chrolofluorocarbon are $CClF_3$, $CCl_2F_2$, and $CCl_3F$. Examples of hydrochrolofluorocarbon are $CHClF_2$, $CHCl_2F$, and $CH_2ClF$. Examples of hydrofluorocarbon are $CHF_3$, and $CH_3F$.

Figure 3A:
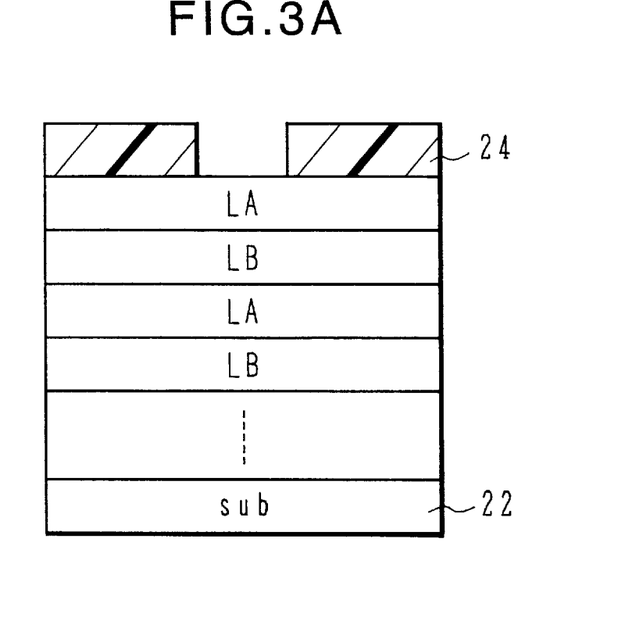
FIGS. 3A and 3B are schematic diagrams showing other examples of a heterojunction laminated layer structure.
Figure 3B:
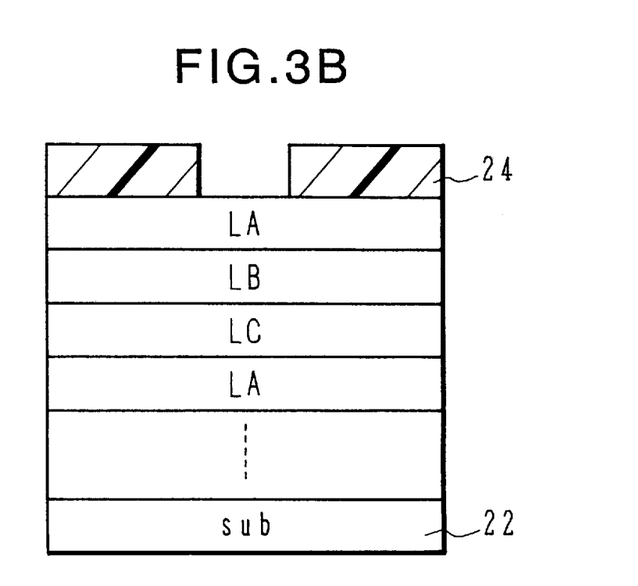

FIGS. 3A and 3B show other examples of a heterojunction laminated layer structure which can be etched efficiently and precisely in the manner described above.

FIG. 3A shows a structure of a laminated layer on a substrate 22 having a layer LA not containing Al and In and a layer LB containing Al and/or In alternately stacked one upon another. A resist mask 24 is formed on this heterojunction laminated layer. If the main etching gas only is used, both the layer LA not containing Al and In and the layer LB containing Al and/or In can be etched. For a layer containing Al, emission by Al-Cl coupling can be detected by monitoring an emission intensity at a wavelength of 261 nm.

For a layer containing In, emission by In can be detected by monitoring an emission intensity at a wavelength of 451 nm. By adding additive gas by a predetermined amount or more after an extinction of the i-th emission peak is monitored, the etching can be automatically stopped at the surface of the (i+1)-th layer containing Al and/or In.

The heterojunction laminated layer structure is not limited to two kinds of the layer containing Al and/or In and the layer not containing Al and In. For example, as shown in FIG. 3B, the same etching control as above can be applied to a heterojunction laminated structure having three kinds of layers LA, LB, and LC sequentially stacked one upon another, one of the three layers containing Al and/or In and the other layers not containing Al and In.

A layer containing Al and/or In is not limited to a single layer. For example, a laminated layer of a layer containing Al and a layer containing In may be used with a layer not containing Al and In. In this case, the spectroscope 17 or narrow pass filter can detect the emission peaks at the wavelengths of 261 nm and 451 nm at the same time or alternately.

The above-described etching method can be applied in the same manner to the general case where etchant gas A can etch both a composition X layer and a composition Y layer, and the etchant gas A added with gas B can etch only the composition Y layer and cannot etch the composition X layer.

Figure 4A:
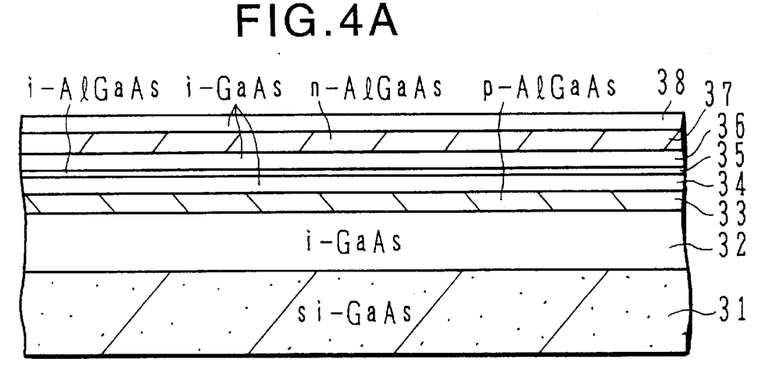
FIGS. 4A to 4C are schematic cross sectional views explaining a method of forming a complementary HFET structure.
Figure 4B:
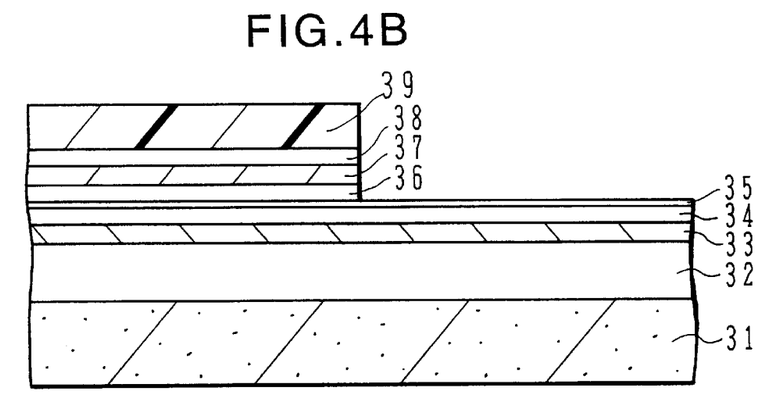
Figure 4C:
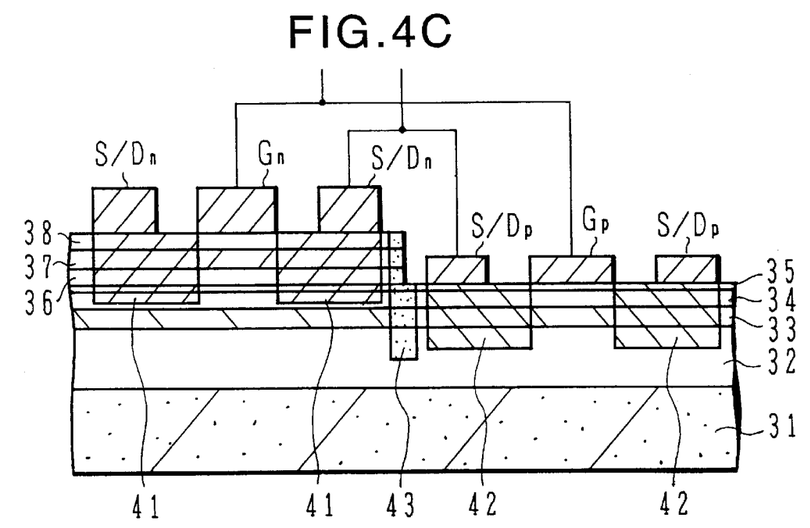

FIG. 4 illustrates a method of manufacturing a complementary HFET suitable for using the above-described etching method.

As shown in FIG. 4A, an i-type GaAs layer 32 having a thickness of about 500 nm, a p-type $Al_{0.3}Ga_{0.7}As$ layer 33 having a thickness of about 20 nm and a MG concentration of about $2\times10^{18} cm^{-3}$, an i-type GaAs layer 34 having a thickness of about 5 nm, an i-type AlGaAs layer 35 having a thickness of about 5 nm, an i-type GaAs layer 36 having a thickness of about 30 nm, an n-type $Al_{0.3}Ga_{0.7}As$ layer 37 having a thickness of about 30 nm and a Si concentration of about $2\times10^{18} cm^{-3}$, and an i-type GaAs layer 38 having a thickness of about 5 nm, are epitaxially grown in this order on a semiinsulating GaAs layer 31 by molecular beam epitaxy (MBE) or metal organic chemical vapor deposition (MOCVD).

As shown in FIG. 4B, on the heterojunction epitaxial laminated layer shown in FIG. 4A, a resist mask 39 is formed which has an opening where a P-type HFET is formed. The wafer with the resist mask 39 is loaded in an etching apparatus such as shown in FIG. 1A, and etching of the region in the opening is carried out until it is automatically stopped at the surface of the i-type AlGaAs layer 35. This etching control will be described with reference to FIG. 5.

Figure 5:
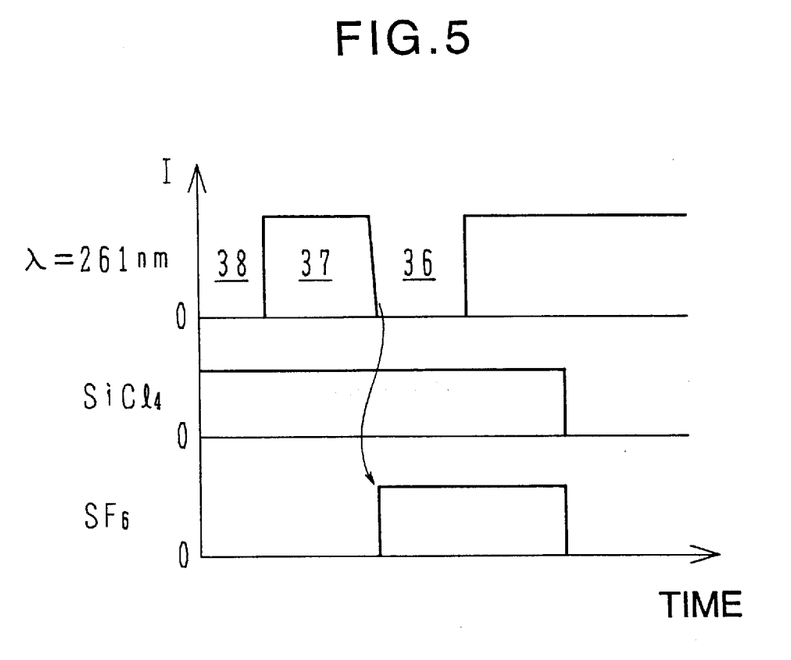
FIG. 5 is a timing chart explaining an etching process.

In FIG. 5, a monitor signal of an emission intensity at the wavelength of 261 nm is shown at the uppermost row in FIG. 5. The middle row and lowermost row schematically illustrate gas supply conditions of the main etching gas $SiCl_4$ and the additive gas $SF_6$. As the $SiCl_4$ gas only is supplied and plasma is generated, etching starts. While the uppermost i-type GaAs layer 38 is etched, an emission peak by Al-Cl coupling at the wavelength of 261 nm is not generated.

When the i-type GaAs layer 38 has been completely etched and the next AlGaAs layer 37 starts being etched, an emission by Al-Cl coupling starts being generated and the monitor signal changes to the high level.

As the etching of the n-type AlGaAs layer 37 is completed, the emission peak at the wavelength of 261 nm extinguishes. Upon detection of this by the monitor signal, the additive gas $SF_6$ starts being added. At this time, the etching gas is a mixed gas of the main etching gas $SiCl_4$ and additive gas $SF_6$. This mixed gas etches the i-type GaAs layer 36, but substantially unetches the underlying i-type AlGaAs layer 35. As a result, the etching automatically stops at the exposed surface of the i-type AlGaAs layer 35.

After the etching is continued for a time period sufficient for etching the i-type GaAs layer 36 completely, the RF power is shut down and the supply of the main etching gas and additive gas is stopped, to thereby expose the surface of the i-type AlGaAs layer 35.

After the automatic stop of the dry etching, the wafer has a structure shown in FIG. 4B. The photoresist mask 39 is removed thereafter.

As shown in FIG. 4C, a WSi layer is formed on the wafer surface and patterned by using a photoresist mask or the like to thus form a gate electrode Gn for the n-type HFET and a gate electrode Gp for a p-type HFET.

By using the gate electrodes Gn and Gp and a photoresist mask as an etching mask, the source/drain regions for the n- and p-type HFETs are formed. Si ions are doped to form n-type impurity doped regions 41, and Be or Mg ions, and F ions are doped to form p-type impurity doped regions 42.d Be and Mg are p-type impurities, and F is an additive for improving an activation yield of impurities. F ions are not necessarily used.

After these ion doped regions are formed, a resist mask if present is removed, and annealing for impurity activation is performed. With the impurities activated by the annealing, $n^+$-type regions 41 and $p^+$-type regions 42 are formed.

Thereafter, a photoresist mask is formed for exposing a separation region for the p- and n-type HFETs. By using this photoresist mask, oxygen ions are doped to form an oxygen ion doped separation region 43.

Next, a photoresist mask is formed for exposing the regions where ohmic electrodes for the n-type HFET are formed. By using this photoresist mask, a laminated layer of an AuGe layer, an Ni layer, and an Au layer is vapor deposited and lifted off to form ohmic electrodes S/Dn of the n-type HFET.

Next, a photoresist mask is formed for exposing the regions where ohmic electrodes for the p-type HFET are formed. By using this photoresist mask, a laminated layer of an Au layer, an Zn and an Au layer is vapor deposited and lifted off to form ohmic electrodes S/Dp of the p-type HFET.

Thereafter, one of the n-type HFET source/drain electrodes S/Dn and one of the p-type HFET source/drain electrodes S/Dp are wired together, and the n-type HFET gate electrode Gn and the p-type HFET gate electrode Gp are wired together.

Other necessary wirings are formed to complete the complementary HFET.

In the embodiment shown in FIGS. 4A to 4C, the p-type HFET is formed at the region below the n-type HFET. This position relation may be made contrary.

Figure 6:
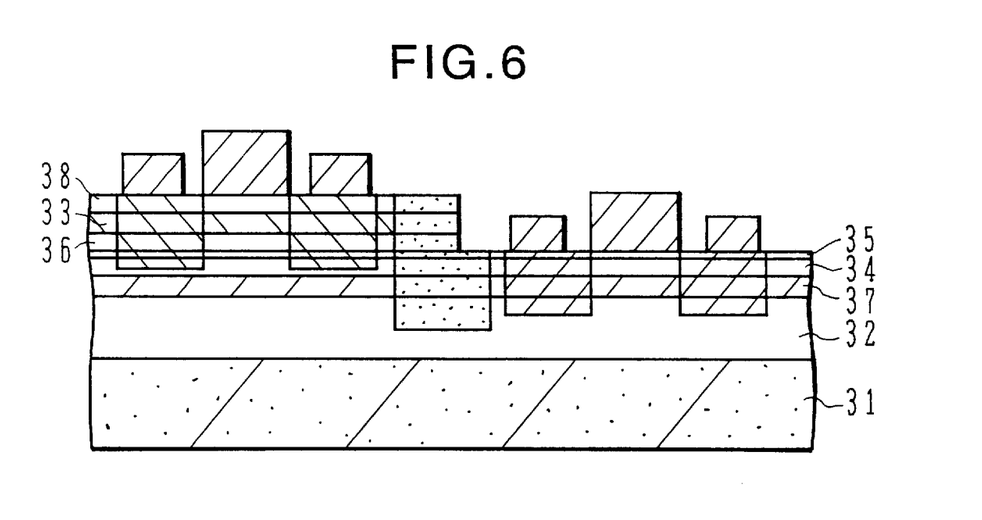
FIG. 6 is a schematic cross sectional view showing another example of a complementary HFET structure.

FIG. 6 shows an example of the structure wherein an n-type HFET is formed at the lower region and a p-type HFET is formed at a higher region. An i-type GaAs layer 32, an n-type GaAs layer 37, an i-type GaAs layer 34, an i-type AlGaAs layer 35, an i-type GaAs layer 36, a p-type AlGaAs layer 33, and an i-type GaAs layer 38 are epitaxially formed in this order on a semiinsulating GaAs layer 31. As compared to the structure shown in FIGS. 4A to 4C, the n-type AlGaAs layer 37 and p-type AlGaAs layer 33 are exchanged.

The heterojunction laminated layer structure shown in FIG. 6 is the same as the structure shown in FIGS. 4A to 4C in the context whether a layer contains Al or not. Accordingly, the etching process and other process like those described with the embodiment shown in FIGS. 4A to 4C can be performed to form the heterojunction laminated layer structure with the upper p-type HFET and lower n-type HFET.

In the structures shown in FIGS. 4A to 4C and FIG. 6, the i-type AlGaAs layer 35 is used for the etching automatic stop. This i-type AlGaAs layer is not necessarily required.

Figure 7:
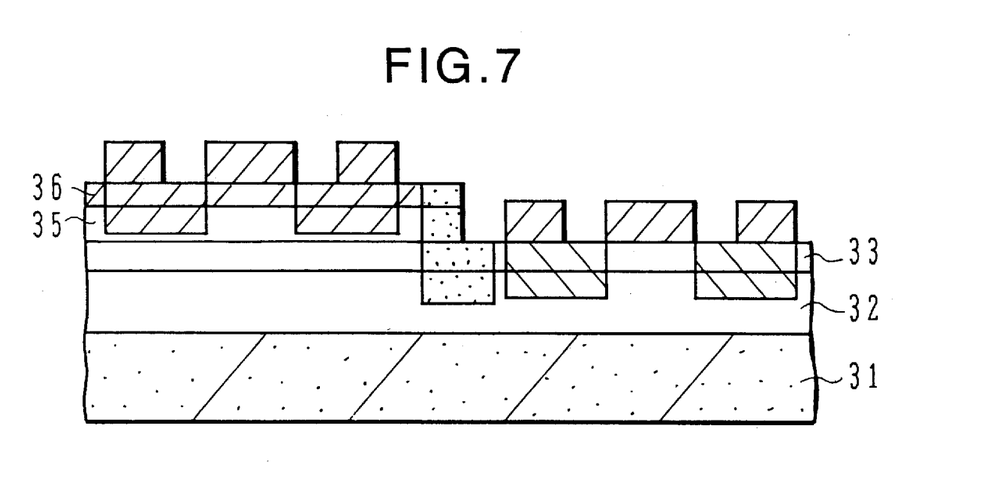
FIG. 7 is a schematic cross sectional view showing another example of a complementary HFET structure.

FIG. 7 shows another example of the structure of a complementary HFET circuit. On a semiinsulating GaAs substrate 31, an i-type GaAs layer 32, an i-type AlGaAs layer 33, an i-type GaAs layer 35, and an n-type AlGaAs layer 36 are laminated. The p-type HFET has the i-type AlGaAs layer 33 on the i-type GaAs layer 32, and is different from a so-called HEMT structure. However, the operation is generally the same as HEMT.

As shown in FIG. 4B, on the heterojunction epitaxial laminated layer shown in FIG. 4A, a resist mask 39 is formed which has an opening where a P-type HFET is formed. The wafer with the resist mask 39 is loaded in an etching apparatus such as shown in FIG. 1A, and etching of the region in the opening is carried out until it is automatically stopped at the surface of the i-type AlGaAs layer 35. This etching control will be described with reference to FIG. 5.

Etching of this heterojunction laminated layer structure like the embodiment shown in FIGS. 4A to 4C stops at the surface of the i-type AlGaAs layer 33. Thereafter, processes like those described with FIG. 4C are performed to complete the structure shown in FIG. 7.

In this structure, the electrodes for the p-type HFET are formed directly on the surface of the i-type AlGaAs layer 33, and the electrodes for the n-type HFET are formed directly on the surface of the n-type AlGaAs layer 36. Also with this structure, etching can be automatically stopped at the surface of the i-type AlGaAs layer 33 when $SF_6$ gas is added while the i-type GaAs layer 35 is etched. The etching can therefore be performed efficiently and precisely.

In the above embodiments, a method of forming a complementary HFET has been described. The invention is not limited only to the above embodiments. For example, this invention is also applicable to manufacturing a group III-V compound semiconductor optical device having a laminated layer of a layer containing Al and/or In and a layer not containing Al and In. It is apparent to those skilled in the art that various modifications, substitutions, combinations and the like can be made without departing from the scope of the appended claims.

We claim:

1. An etching method comprising the steps of:

etching a laminated layer of a plurality of layers made of different kinds of materials by an etchant gas A until one of the layers is completely etched, leaving a first lower layer disposed under said one layer, and a second lower layer disposed under said first lower layer, the second lower layer being made of one kind of material and the first lower layer being made of another kind of material, said etchant gas A being capable of etching layers made of said different kinds of materials and a mixture of said etchant gas A and an additive gas B being capable of etching said another kind of material but substantially unable to etch said one kind of material; and etching said first layer under said one layer by adding said additive gas B to said etchant gas A, thereby automatically stopping etching at said second lower layer.

2. A method according to claim 1, wherein said plurality of layers are made of two different kinds of materials, and include a layer made of compound semiconductor containing Al or In and a layer made of compound semiconductor not containing Al and In.

3. A method according to claim 2, wherein said etchant gas A comprises a gas selected from the group consisting of $SiCl_4$, $CCl_4$, $Cl_2$, and a mixed gas thereof, and said additive gas comprises a gas selected from the group consisting of $SF_6$, $CF_4$, chlorofluorocarbon, hydrochlorofluorocarbon, hydrofluorocarbon, halon gas which contains fluorine, and a mixed gas thereof.

4. A method according to claim 3, wherein said chlorofluorocarbon gas is a gas of $CClF_3$, $CCl_2F_2$, or $CCl3F$ or a mixed gas thereof.

5. A method according to claim 3, wherein said hydrofluorocarbon gas is a gas of $CHF_3$ or $CH_3F$ or a mixed gas thereof.

6. A method according to claim 3, wherein said hydrochlorofluorocarbon gas is a gas of $CHClF_2$, $CHCl_2F$, or $CH_2ClF$ or a mixed gas thereof.

7. A method according to claim 1, wherein said etching step is a plasma etching step, and the method further comprises a step of monitoring an emission specific to at least one kind of said different kinds of materials.

8. A method according to claim 7, wherein one of said two difference kinds of materials is AlGaAs, said etchant gas A comprises a gas of Cl, and said emission is an emission by Al-Cl coupling.

9. A method according to claim 7, wherein one of said two different kinds of materials is a compound semiconductor containing In, and said emission is an emission by In.

10. A method according to claim 7, wherein said monitoring step includes a step of counting an occurrence frequency of said emission.

11. A method of manufacturing a heterojunction semiconductor device having a semiconductor substrate and a semiconductor laminated layer formed on the semiconductor substrate, the semiconductor laminated layer having a first compound semiconductor layer not containing Al as the composition, a second compound semiconductor layer formed on the first compound semiconductor layer, the second compound semiconductor layer containing Al as the composition, a third compound semiconductor layer formed on the second compound semiconductor layer, the third compound semiconductor layer not containing Al as the composition, and a fourth compound semiconductor layer formed on the third compound semiconductor layer, the fourth compound semiconductor layer containing Al as the composition, said method comprising:

a first etching step of etching said fourth compound semiconductor layer and part of said third compound semiconductor layer by an etchant gas comprising Cl or Br and not comprising F; and a second etching step of etching the remaining part of said third compound semiconductor layer by an etching gas comprising F and Cl, or F and Br which cannot etch the second compound semiconductor layer.

12. A method according to claim 11, wherein said semiconductor laminated layer further includes a fifth compound semiconductor layer formed on said second compound semiconductor layer, said fifth compound semiconductor layer not containing Al as the composition, and a sixth compound semiconductor layer formed on said fifth compound semiconductor layer, said sixth compound semiconductor layer containing Al as the composition, said fifth and sixth compound semiconductor layers being formed between said second and third compound semiconductor layers, and wherein said second etching step automatically stops at the surface of said sixth compound semiconductor layer.

13. A method according to claim 11, wherein said first etching step uses plasma etching, and is performed while monitoring a plasma emission peak.

* * * * *